(12) United States Patent
Archer et al.

(10) Patent No.: US 10,609,839 B1
(45) Date of Patent: Mar. 31, 2020

(54) LIQUID SUBMERSION COOLED ELECTRONIC SYSTEMS AND DEVICES

(71) Applicant: LiquidCool Solutions, Inc., Rochester, MN (US)

(72) Inventors: Sean Michael Archer, Rochester, MN (US); Steve Shafer, Rochester, MN (US); David Roe, Rochester, MN (US); Lyle Rick Tufty, Rochester, MN (US)

(73) Assignee: LIQUIDCOOL SOLUTIONS, INC., Rochester, MN (US)

( * ) Notice: Subject to any disclaimer, the term of this patent is extended or adjusted under 35 U.S.C. 154(b) by 0 days.

(21) Appl. No.: 16/145,408

(22) Filed: Sep. 28, 2018

(51) Int. Cl.
*H05K 7/20* (2006.01)
*F28D 1/02* (2006.01)
*G06F 1/20* (2006.01)

(52) U.S. Cl.
CPC ....... *H05K 7/20236* (2013.01); *F28D 1/0206* (2013.01); *G06F 1/20* (2013.01); *H05K 7/20272* (2013.01); *H05K 7/20763* (2013.01); *G06F 2200/201* (2013.01)

(58) Field of Classification Search
CPC ........... H05K 7/20236; H05K 7/20763; H05K 7/20272; G06F 1/20; G06F 2200/201; F28D 1/0206
USPC ............................................. 361/679.53, 699
See application file for complete search history.

(56) References Cited

U.S. PATENT DOCUMENTS

| | | | |
|---|---|---|---|
| 4,814,786 A * | 3/1989 | Hoisington | B41J 2/17593 347/88 |
| 7,403,392 B2 * | 7/2008 | Attlesey | G06F 1/20 165/104.33 |
| 7,905,106 B2 | 3/2011 | Attlesey | |
| 7,911,793 B2 | 3/2011 | Attlesey | |
| 8,089,764 B2 | 1/2012 | Attlesey | |
| 9,451,726 B2 | 9/2016 | Regimbal et al. | |
| 9,596,787 B1 | 3/2017 | Iyengar et al. | |
| 2010/0101765 A1 * | 4/2010 | Campbell | H05K 7/20809 165/104.33 |
| 2010/0226094 A1 * | 9/2010 | Attlesey | H05K 7/20772 361/699 |
| 2010/0246118 A1 * | 9/2010 | Attlesey | G06F 1/20 361/679.53 |
| 2010/0290190 A1 * | 11/2010 | Chester | H05K 7/20772 361/701 |
| 2013/0019614 A1 * | 1/2013 | Campbell | H05K 7/20136 62/62 |
| 2013/0068423 A1 | 3/2013 | Campbell et al. | |
| 2014/0133099 A1 | 5/2014 | Campbell et al. | |

(Continued)

OTHER PUBLICATIONS

U.S. Appl. No. 16/137,015, filed Sep. 20, 2018, 57 pages.

(Continued)

*Primary Examiner* — Jayprakash N Gandhi
*Assistant Examiner* — Stephen S Sul
(74) *Attorney, Agent, or Firm* — Hamre, Schumann, Mueller & Larson, P.C.

(57) ABSTRACT

Liquid submersion cooling devices and systems are described that use a cooling liquid, for example a dielectric cooling liquid, to submersion cool individual electronic devices or an array of electronic devices. In one embodiment, the electronic device includes a non-pressurized device housing defining an interior space where pressure in the interior space equals or is only slightly different than pressure outside the non-pressurized device housing.

15 Claims, 7 Drawing Sheets

(56) References Cited

U.S. PATENT DOCUMENTS

| | | | |
|---|---|---|---|
| 2015/0013940 A1* | 1/2015 | Best | H05K 7/20763 |
| | | | 165/80.4 |
| 2017/0177041 A1 | 6/2017 | Shelnutt et al. | |
| 2017/0208705 A1 | 7/2017 | Swenson et al. | |
| 2017/0280577 A1* | 9/2017 | Laneryd | H01F 27/14 |
| 2017/0280587 A1* | 9/2017 | Watanabe | H01L 23/473 |
| 2017/0311484 A1* | 10/2017 | Ozyalcin | H05K 7/20236 |
| 2018/0295745 A1* | 10/2018 | De Meijer | G06F 1/20 |
| 2019/0200483 A1* | 6/2019 | Tian | H05K 7/20327 |

OTHER PUBLICATIONS

"Freeing HPC From the Datacentre—KU:L Sistem", obtained from http://www.iceotope.com/rackservers/; date is unknown—in Applicant's possession about Aug. 5, 2018; 9 pages.

Day et al., "Liquid Cooling Technologies for Data Centers and Edge Applications", White paper 265, Schneider Electric, in applicant's possession on or about Jul. 3, 2019, 12 pages.

Written Opinion and International Search Report for PCT/US2019/44678 dated Nov. 22, 2019.

* cited by examiner

LIQUID SUBMERSION COOLED ELECTRONIC SYSTEMS AND DEVICES

FIELD

This disclosure relates to liquid submersion cooling of electronic array systems and devices.

BACKGROUND

Liquid submersion cooled electronic systems and devices are known. One example of an array of liquid submersion cooled electronic devices is an array of liquid submerged servers (LSS's) arranged in a rack system. An example of an array of LSS's in a rack system is disclosed in U.S. Pat. Nos. 7,905,106, 7,911,793, and 8,089,764. Another example of an array of liquid submersion cooled electronic devices is disclosed in U.S. Pat. No. 9,451,726.

SUMMARY

Liquid submersion cooling devices and systems are described that use a cooling liquid, for example a dielectric cooling liquid, to submersion cool individual electronic devices or an array of electronic devices. In one embodiment, the electronic device includes a non-pressurized (or "zero" pressure) device housing defining an interior space where pressure in the interior space equals, or is only slightly greater than, pressure outside the non-pressurized device housing.

In one embodiment, a liquid submersion cooled electronic device can include a non-pressurized device housing defining an interior space where pressure in the interior space equals pressure outside the non-pressurized device housing. One or more heat generating electronic components, for example, a plurality of heat generating electronic components, are disposed within the interior space of the device housing, and a dielectric cooling liquid is in the interior space, with the dielectric cooling liquid partially or fully submerging and in direct contact with one or more of the heat generating electronic components. A pump has a pump inlet in fluid communication with the interior space and a pump outlet. A heat exchanger, for example a liquid-to-liquid heat exchanger, has a heat exchanger inlet in fluid communication with the pump outlet, and a heat exchanger outlet. A liquid distribution manifold is within the interior space, with the liquid distribution manifold having a manifold inlet in fluid communication with the heat exchanger outlet, and a plurality of manifold outlets. A tube has an inlet end thereof connected to one of the liquid manifold outlets, and an outlet end thereof is adjacent to one of the heat generating electronic components to direct a return flow of dielectric cooling liquid directly onto the one heat generating electronic component. A liquid submersion cooled electronic system can include a plurality of the liquid submersion cooled electronic devices.

One example application of the liquid submersion cooling devices and systems described herein is for use with an array of LSS's arranged in a rack system. However, the concepts described herein can be used in other applications where arrays of electronic devices are liquid submersion cooled, including, but not limited to, blade servers, disk arrays/storage systems, solid state memory devices, storage area networks, network attached storage, storage communication systems, routers, telecommunication infrastructure/switches, wired, optical and wireless communication devices, cell processor devices, printers, power supplies, etc.

The liquid submersion cooling devices and systems described herein can be used in any area that could benefit from the advantages of liquid submersion cooling. In one example, the liquid submersion cooling devices and systems can be used in blockchain computing (cryptocurrency) applications, for example in either ASIC or GPU computer mining configurations. The liquid submersion cooling devices and systems can also be used in deep learning applications, for example in multi-GPU configurations supporting maximum bandwidth and direct memory access (DMA) of high performance GPUs. The liquid submersion cooling devices and systems can also be used in artificial intelligence and high-performance computing (HPC) clusters with multiple co-processor configurations, for example multi-GPU configurations supporting DMA capabilities of GPU co-processors. Many other applications and uses of the liquid submersion cooling devices and systems described herein are possible and contemplated.

The liquid submersion cooling devices and systems described herein do not require fully sealed electronic device housings, which helps to reduce cost and simplifies access to the electronics for service and modifications. Liquid submersion cooling also has superior cooling efficiency compared to air cooling, thereby reducing power requirements and associated operating costs.

DRAWINGS

DETAILED DESCRIPTION

The cooling liquid used to cool the electronics in the electronic devices described herein can be, but is not limited to, a dielectric liquid. The cooling liquid is preferably a single phase dielectric cooling liquid. It is preferred that the single phase dielectric cooling liquid have a high enough thermal transfer capability and heat capacity to handle the amount of heat being generated by the submerged heat generating electronic components so that the cooling liquid does not change state from a liquid to a gas during the heat absorption process. Submersion cooling of the heat generating electronic components means that enough of the cooling liquid is present so that one or more of the heat generating electronic components are partially or fully submerged in the dielectric cooling liquid in direct intimate contact with the dielectric cooling liquid.

The heat-generating electronic component(s) to be submerged in the cooling liquid can be any electronic component(s) that generate heat and that one may wish to cool by partially or fully submerging the electronic components in the cooling liquid. For example, the electronic components can include one or more processors, for example a CPU and/or a GPU, one or more power supplies, one or more switches, one or more data storage drives, one or more memory modules, and other electronic components. The electronic systems formed by the electronic components include, but are not limited to, blade servers, disk arrays/storage systems, solid state memory devices, storage area networks, network attached storage, storage communication systems, routers, telecommunication infrastructure/switches, wired, optical and wireless communication devices, cell processor devices, printers, power supplies, and the like.

Figure 1:
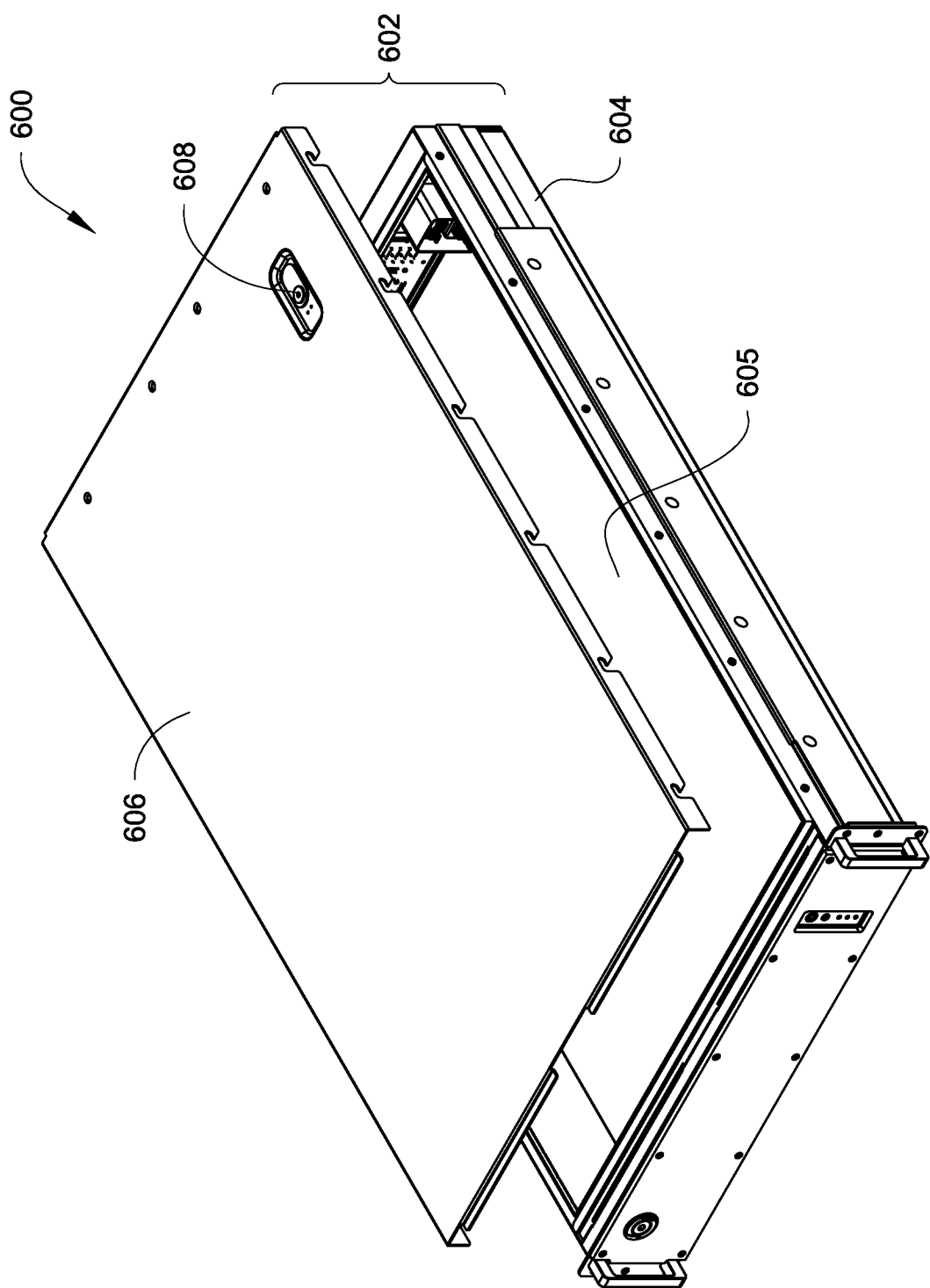
FIG. 1 is a perspective view of still another example of a liquid submersion cooled electronic device described herein.
Figure 2:
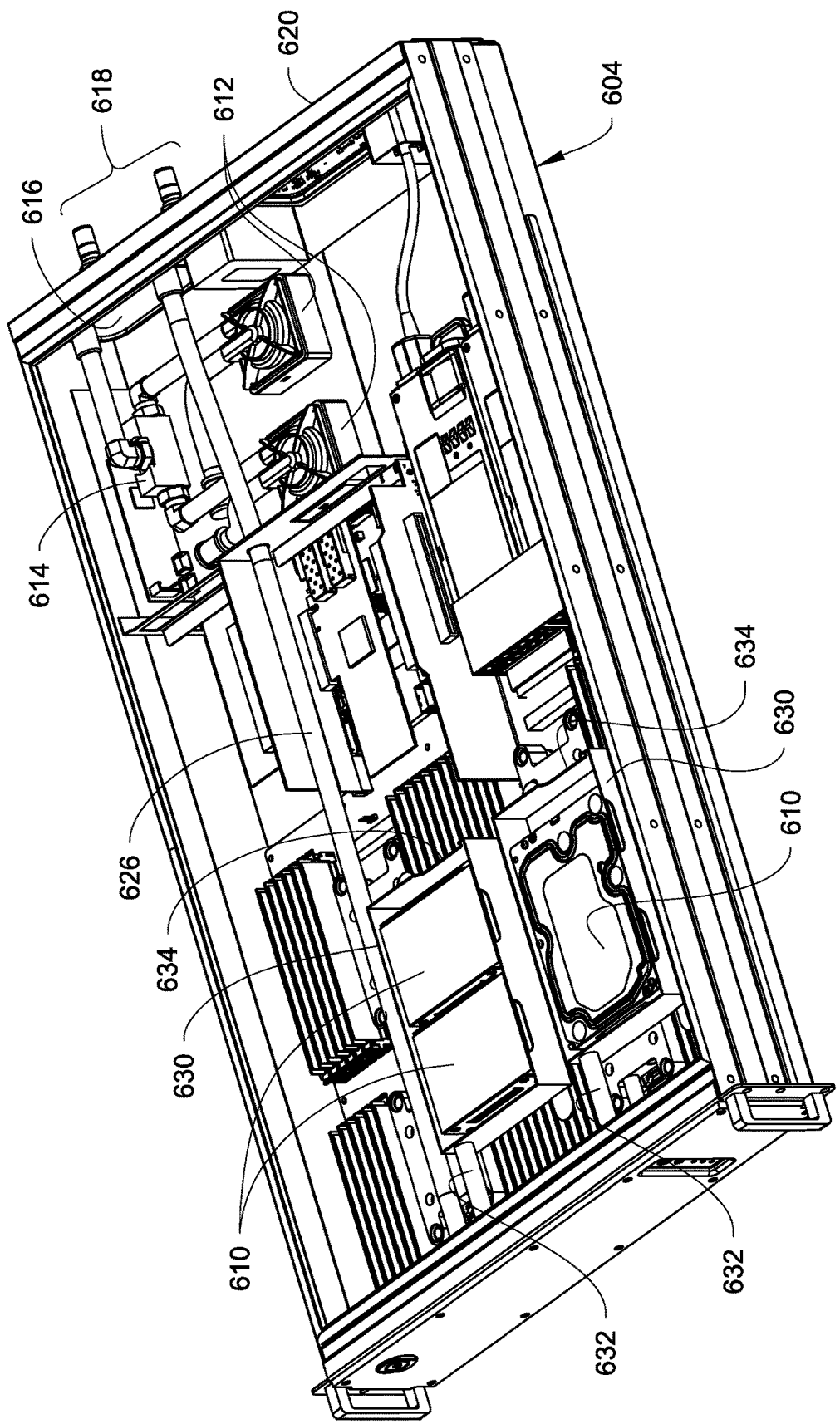
FIG. 2 is a partial perspective view of the liquid submersion cooled electronic device of FIG. 1 with the cover removed.
Figure 3:
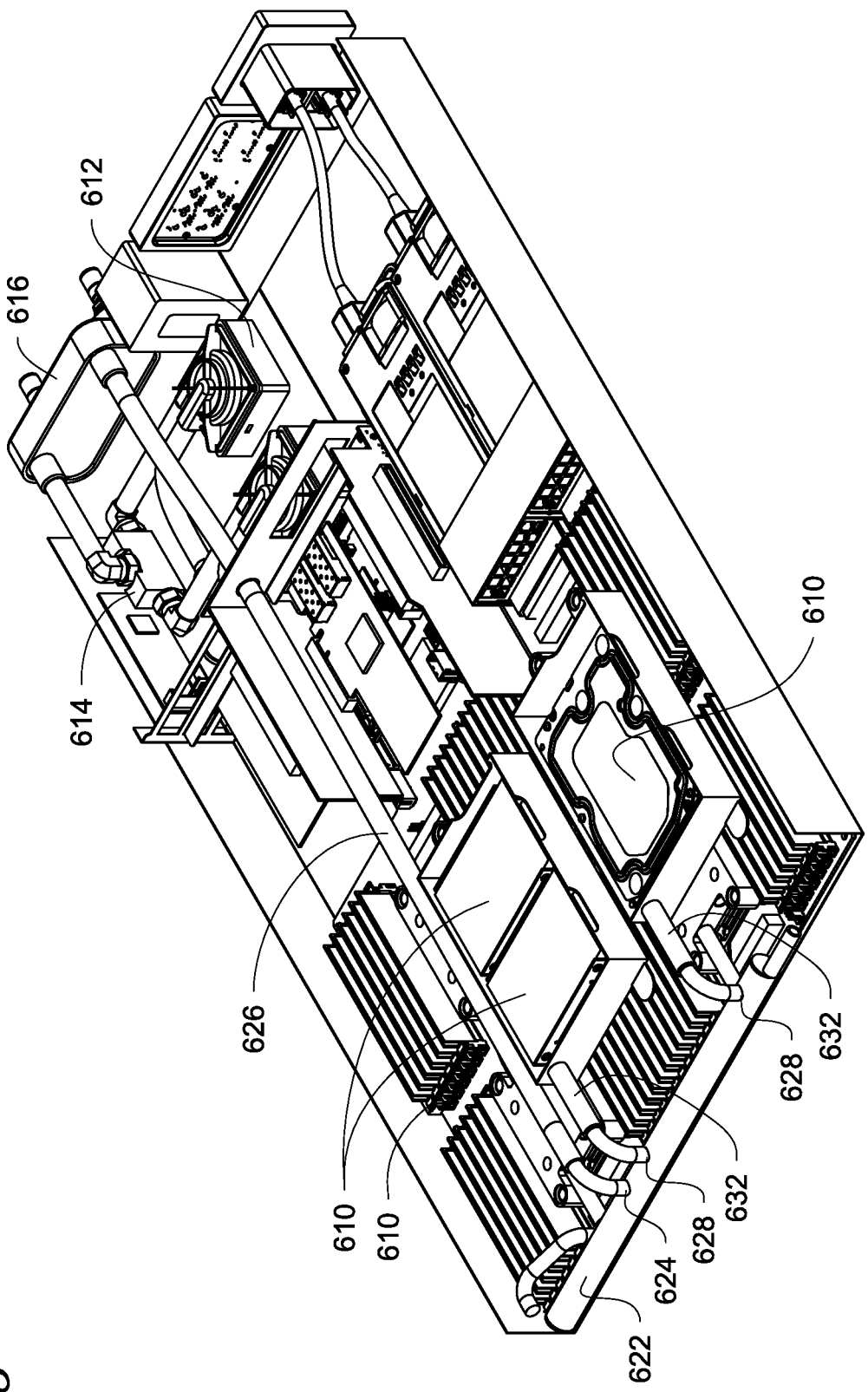
FIG. 3 is a perspective view of the liquid submersion cooled electronic device of FIG. 1 with the housing removed.

FIGS. 1-3 illustrate an example of a liquid submersion cooled electronic device 600. The device 600 includes a device housing 602 that is formed by a bottom liquid tight tray 604 defining an interior space 605 and a cover 606 that removably fits on the tray 604 to prevent contaminants from falling into cooling liquid that is contained with the interior space 605 of the tray 604. The tray 604 has side walls and a bottom wall that define the interior space 605, and at least a partially open top. In the illustrated example, the entire top of the tray 604 is shown as being open. However, in other embodiments, only a portion of the top of the tray 604 can be open. The cover 606 is removably disposed over the open portion of the top of the tray 604.

The housing 602 can be referred to as non-pressurized (or "zero" pressure) or minimally pressurized so that the pressure (or vacuum) in the interior space 605 equals, or is only slightly greater/less than, pressure outside the device housing. For example, the pressure in the interior space 605 can equal ambient pressure. In another embodiment, the pressure in the interior space may be a small pressure having a value which may be small and difficult to measure, for example up to about 0.1 psi. So a non-pressurized device housing as used herein is intended to encompass the interior space 605 having zero pressure (i.e. the pressure in the interior space equals ambient pressure) as well as encompass small pressures/vacuums, for example a pressure of up to about 0.1 psi greater than ambient pressure. This is in contrast to some device housings for liquid submersion cooled electronics which may be referred to as pressurized or sealed housings which might typically operate at positive measureable pressure levels greater than ambient air pressure as a consequence of being connected to other similarly liquid immersion cooled electronic devices involving the same fluid loop and experiencing the pressure produced by a centralized or remote pump which produces fluid circulation by creating a positive pressure on the outlet of the pump and a corresponding negative or lower pressure on the inlet to the pump.

The minimization of pressure between the interior space 605 and the ambient can be achieved in any suitable manner. For example, in one embodiment a pressure relief/equalization mechanism 608, such as an air vent or check valve or other pressure relief/equalization mechanism, can be provided in the cover 606 as illustrated in FIG. 1 to provide air communication between the interior space and the ambient. In another embodiment, pressure minimization can be achieved simply as a result of the cover 606 not fitting closely or sealing with the tray 604. Because the housing 602 is not intended to be pressurized, there is no need to seal and pressurize the device 600. However, the tray 604 does need to be sealed or leak proof to prevent leakage of cooling liquid therefrom that will be disposed within the interior space 605. Minimization of pressure in the device 600 is permissible because the dielectric cooling liquid is recirculated within the tray 604 and the heat exchanger (described below) and there is no need for the device 600 to operate at a pressure that is different than the pressure of the ambient environment.

As best seen in FIGS. 2 and 3, various heat generating electronic components 610 are disposed within the interior space 605. The electronic components 610 can vary based on the type of electronic system the device 600 is to form. Examples of electronic components 610 that can be used includes, but is not limited to, one or more processors, for example a CPU and/or a GPU, one or more power supplies, one or more switches, one or more data storage drives, one or more memory modules, and other electronic components. The electronic systems formed by the electronic components can include, but are not limited to, blade servers, disk arrays/storage systems, solid state memory devices, storage area networks, network attached storage, storage communication systems, routers, telecommunication infrastructure/switches, wired, optical and wireless communication devices, cell processor devices, printers, power supplies, and the like.

A dielectric cooling liquid is disposed in the interior space 605 with the dielectric cooling liquid partially or fully submerging and in direct contact with at least some the heat generating electronic components 610. The level of the dielectric liquid in the tray 604 will be sufficient to partially or fully submerse the electronic components that one wishes to submersion cool.

A cooling liquid distribution circuit is provided for distributing the cooling liquid within the device 600. In the embodiment illustrated in FIGS. 2 and 3, the distribution circuit includes one or more pumps 612 within the interior space 605 and having a pump inlet in fluid communication with the bulk cooling liquid contained in the interior space 605 and a pump outlet. The illustrated example shows two of the pumps 612, one pump 612 used as a primary pump and the other pump 612 used as a back-up pump in case of failure of the primary pump. A control valve 614 can be provided that is fluidly connected to the outlet of each pump 612 and which can be controlled by a suitable pump controller based on monitored performance of the pumps 612 to select which pumps outlet will be used. The pumps 612 can be partially or fully submerged in the cooling liquid, or the pumps 612 may not be submerged but have inlets in the cooling liquid.

A heat exchanger 616 is disposed within the interior space 605 and has an inlet in fluid communication with the pump outlet via the control valve 614, and an outlet. The heat exchanger 616 can have any configuration that is suitable for reducing the temperature of the returning cooling liquid. In the illustrated example, the heat exchanger 616 is configured as a liquid-to-liquid heat exchanger that is connected to an external cooling fluid loop 618 which supplies a secondary cooling liquid to the heat exchanger 616. However, the heat exchanger 616 can be a liquid-to-air heat exchanger or any other configuration that can reduce the temperature of the returning cooling liquid.

The heat exchanger 616 can be mounted at any suitable location within the housing 602. In the illustrated example, the heat exchanger 616 is shown as being mounted on the interior facing surface of an end wall 620 of the tray 604.

The heat exchanger 616 may or may not be partially or fully submerged in the cooling liquid disposed within the interior space 605.

Referring to FIG. 3 along with FIG. 2, a liquid distribution manifold 622 is disposed within the interior space 605 and has an inlet 624 that is in fluid communication with the outlet of the heat exchanger 616 via a supply line 626, and a plurality of manifold outlets 628 leading from the manifold 622. The liquid distribution manifold 622 distributes the cooling liquid to targeted ones of the electronic components 610 before the cooling liquid enters the bulk cooling liquid within the interior space 605.

The returning cooling liquid can be directed from the manifold 622 directly onto some of the electronic components 610, such as CPUs, GPUs, power supplies, switches, or the like. For example, as shown in FIGS. 2 and 3, one or more open top trays 630 are disposed within the interior space 605, and some of the electronic components 610 are disposed in the trays 630. Supply tubes 632 extend from the outlets 628 to each tray 630 in order to direct the returning cooling liquid into the tray 630. The trays 630 retain the cooling liquid around the electronic component(s) 610 located within the trays 630. One or more liquid outlets or weirs 634 are formed in a side wall of each tray 630 from which dielectric cooling liquid exits the space defined by the tray 630. In use, each tray 630 is designed to fill with the cooling liquid to a level sufficient to liquid submersion cool the electronic component(s) 610 with the trays 630. The cooling liquid then spills out from the weir(s) 634 and flows by gravity into the bulk cooling liquid in the remainder of the interior space 605, where it can then be pumped by the pump 612 to the heat exchanger 616 for cooling. Some of the electronic components within the interior space 605 but not within one of the trays 630 may also be partially or fully submerged in the bulk cooling liquid contained in the interior space 605.

The fluid distribution manifold 622 can be configured to help proportion the flow of the cooling liquid to each of the outlets 628 to optimally manage the flow from each of the outlets 628 to the trays 630. For example, the sizes of the outlets 628 can be varied, the sizes of the supply tubes 632 can be varied, adjustable valves can be provided in the outlets 628 or in the tubes 632, or the like. Management of the flow is useful in order to direct the proper amount of and/or the correct pressure of the returning cooling liquid.

The weir(s) 634 is disposed at the maximum dielectric cooling liquid level of the tray 630 wherein the weir(s) 634 establishes the level of the dielectric cooling liquid within the tray 630 and establishes a volumetric rate of flow of the dielectric cooling liquid within the tray 630 that is needed for the cooling of the heat generating electronic component(s) within the tray 630. As used throughout this description and claims, a weir is an outlet for the cooling liquid where the cooling liquid exits via gravity without using pump pressure connected to the weir. A weir is different than, and distinct from, an outlet which during use is intended to be connected to a pump so that pump pressure causes the cooling liquid to exit through the outlet, such as the outlets 52b, 112 described in U.S. Pat. No. 7,905,106.

In this embodiment, the pumps 612 and the heat exchanger 616 are disposed at a first end of the device housing 602, and the liquid distribution manifold 622 is disposed at a second end of the device housing 602 opposite to the first end. However, other arrangements are possible.

Figure 4:
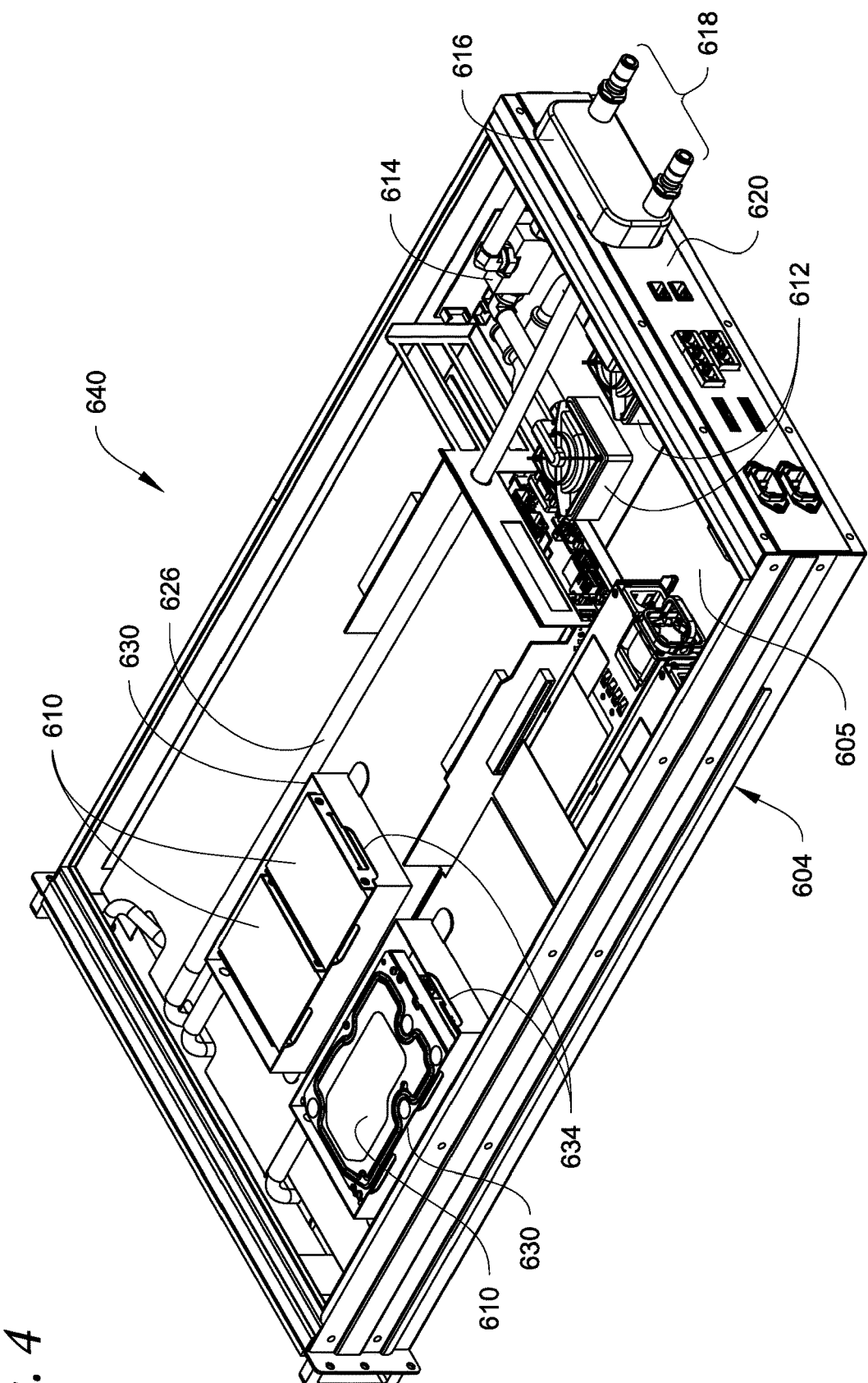
FIG. 4 is a perspective view of still another example of a liquid submersion cooled electronic device described herein that is similar to the device in FIGS. 1-3, but with the heat exchanger in an alternative location.

FIG. 4 illustrates another example of a liquid submersion cooled electronic device 640 that is similar to the device 600 and like elements are referenced using the same reference numerals. In this embodiment, the heat exchanger 616 is disposed outside the interior space 605 of the device housing so that the cooling liquid exits the device housing to be cooled. For example, the heat exchanger 616 can be mounted on the exterior surface of the end wall 620 of the tray 604. Although not illustrated, the device 640 will include a cover like the cover 606 in FIG. 1.

Figure 5:
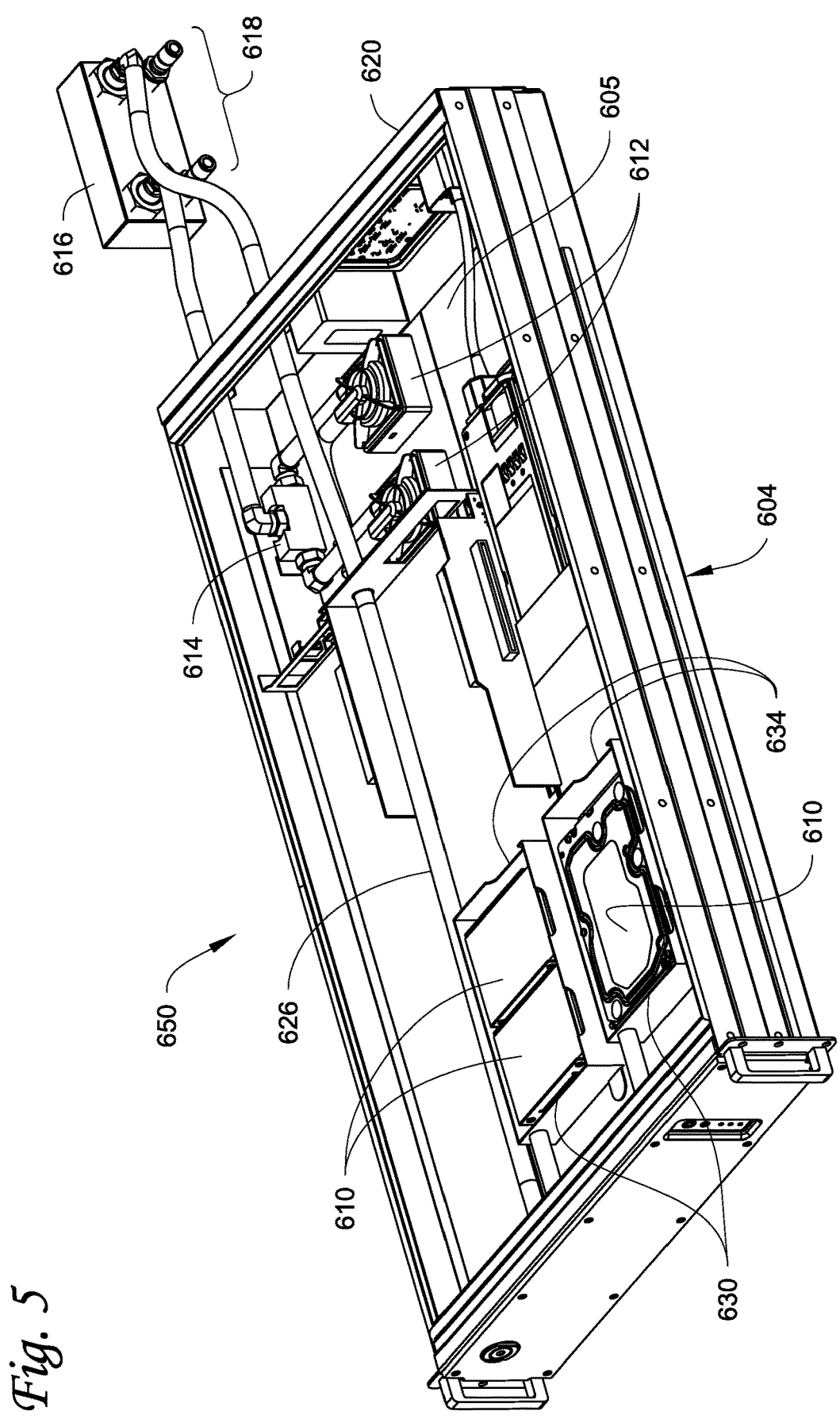
FIG. 5 is a perspective view of still another example of a liquid submersion cooled electronic device described herein that is similar to the device in FIGS. 1-3, but with the heat exchanger in another alternative location.

FIG. 5 illustrates another example of a liquid submersion cooled electronic device 650 that is similar to the device 600 and like elements are referenced using the same reference numerals. In this embodiment, the heat exchanger 616 is disposed outside the interior space 605 of the device housing so that the cooling liquid exits the device housing to be cooled. In this embodiment, the heat exchanger 616 is not mounted on the end wall 620 of the tray 604, but is instead mounted at an exterior location separate from the device 650 so that the heat exchanger 616 is not mounted on the device housing. Although not illustrated, the device 650 will include a cover like the cover 606 in FIG. 1.

Figure 6:
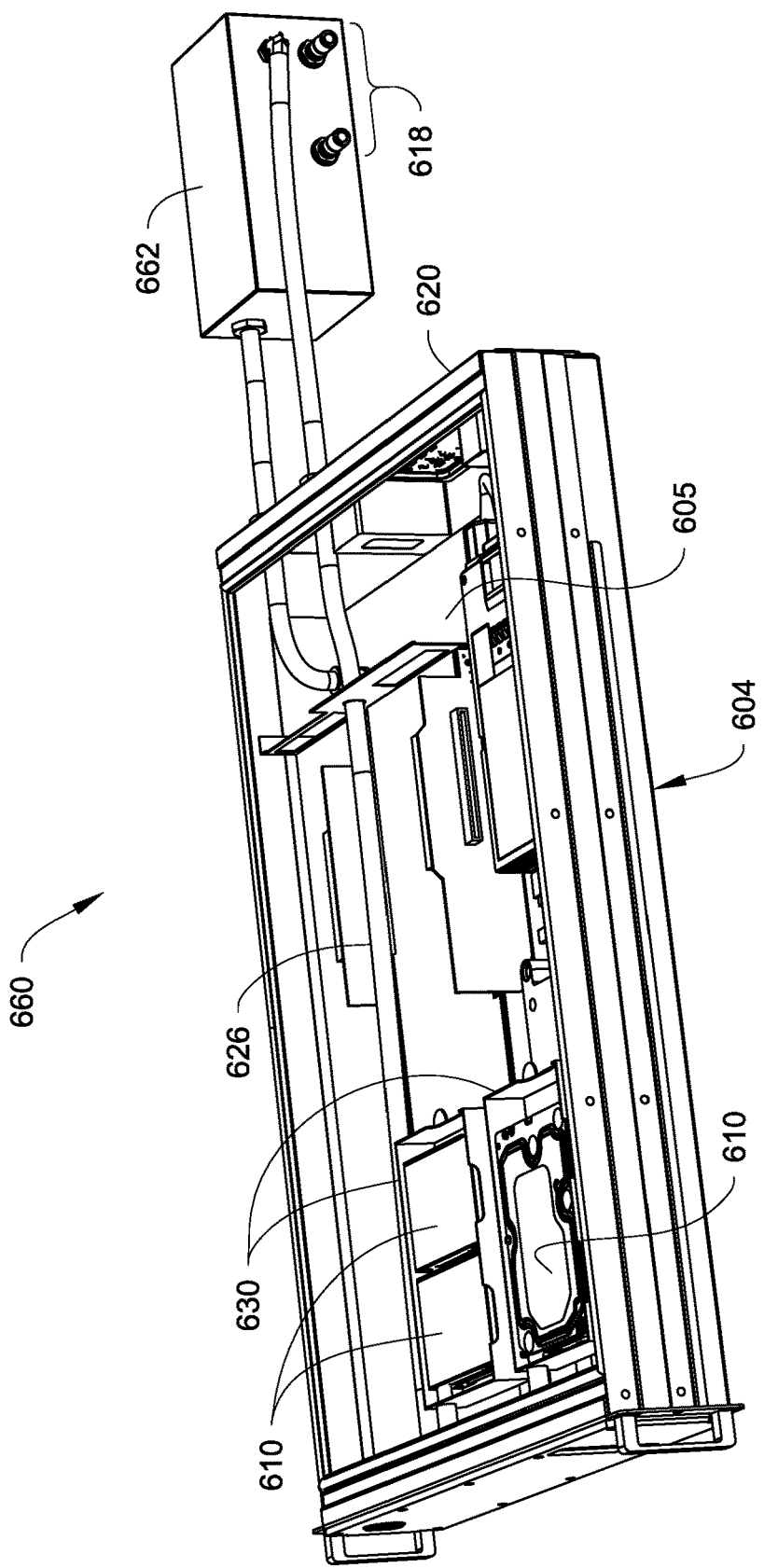
FIG. 6 is a perspective view of still another example of a liquid submersion cooled electronic device described herein that is similar to the device in FIGS. 1-3, but with a cooling distribution unit.

FIG. 6 illustrates another example of a liquid submersion cooled electronic device 660 that is similar to the device 600 and like elements are referenced using the same reference numerals. In this embodiment, both the heat exchanger and the pump(s) are disposed outside the interior space 605 of the device housing. In addition, the pump(s) and the heat exchanger are incorporated into a common unit referred to as cooling distribution unit 662. The cooling distribution unit 662 is illustrated as not mounted on the end wall 620 of the tray 604, but is instead mounted at an exterior location separate from the device 660. However, the cooling distribution unit 662 could be mounted on the exterior surface of the end wall 620. Although not illustrated, the device 660 will include a cover like the cover 606 in FIG. 1.

Figure 7:
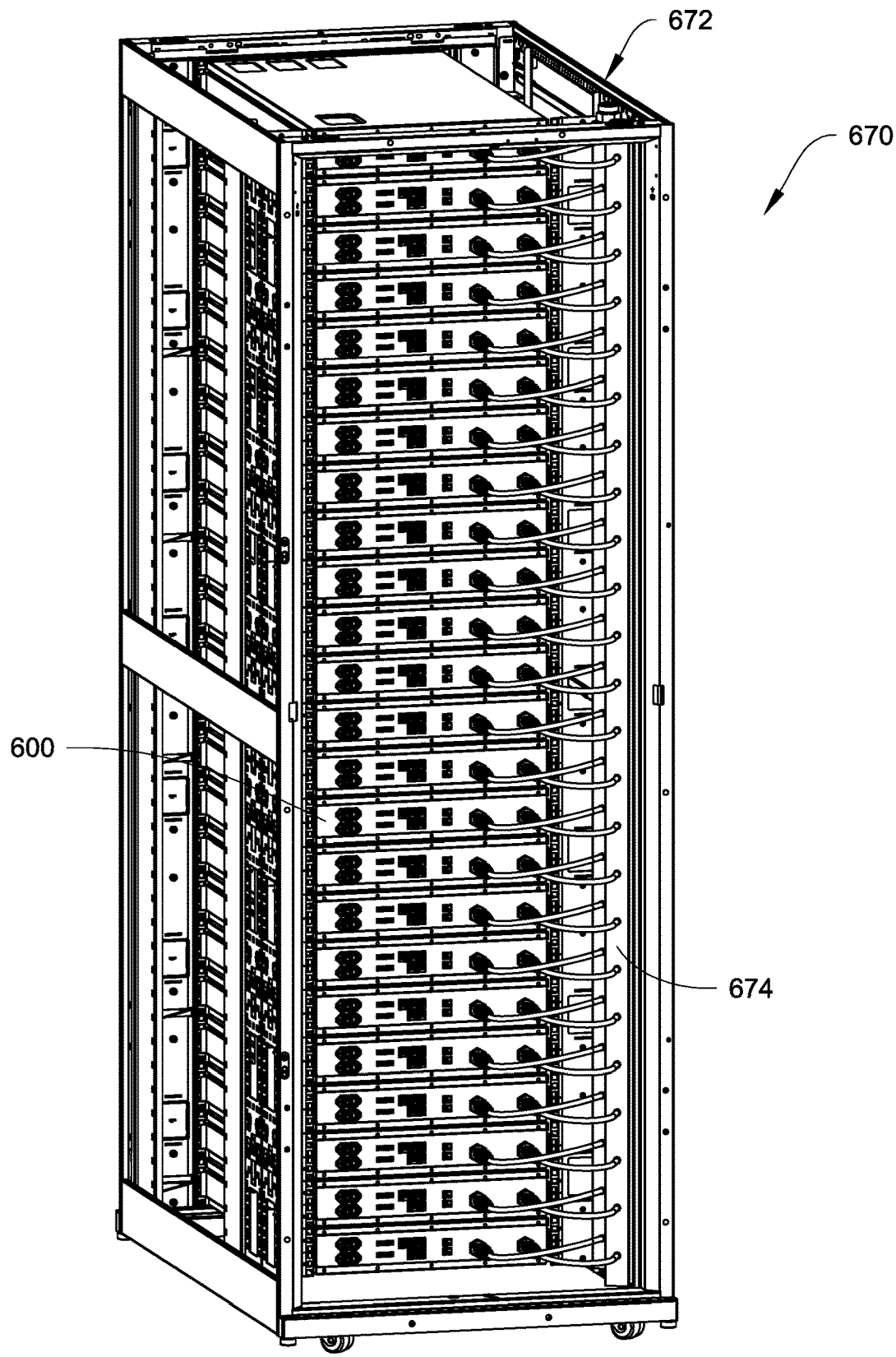
FIG. 7 is a rear view of a vertical array of liquid submersion cooled electronic devices described herein disposed on a rack.

Referring to FIG. 7, a plurality of the devices 600 of FIGS. 1-3 are illustrated as being disposed together in a vertical array 670, for example on a rack 672. Alternatively, the devices 600 can be used individually and separately from one another. In one example implementation, a plurality of the electronic devices 600 can be arranged into a plurality of vertically spaced rows on the rack 672. FIG. 7 illustrates a vertical manifold 674 mounted on the rack 672 that is part of the external cooling fluid loop 618 and is used to bring the secondary cooling liquid to the heat exchanger 616. A similar vertical array on the rack 672 can be implemented for the electronic devices 640, 650, 660.

The pumps described herein can be adaptively controlled by the pump controller depending upon desired performance of the electronic device(s). For example, the pumps can be controlled to operate in series or in parallel. In addition, the pumps can be operated in a redundant mode where a second pump acts as a back-up to the first pump in the event of failure of the first pump.

The electronic devices and vertical array design described herein are extremely versatile for various system configurations and which is easily accessible for service since each electronic device has its own independent fluid cooling loop. Further, the device housing 602 does not need to be designed with strengthening structures between the floor of the tray 604 and the cover 606 within the interior space 605 to compensate for deflection forces which would be present if the device 600 were sealed and operating at a net positive gage pressure, which permits the entire device housing 602 to be designed to be an open volume within which many configurations of electronics can be mounted. In addition, the electronic devices and vertical array is also more efficient in terms of the volume of cooling liquid required to accomplish the immersion cooling compared with sealed/pressurized filled systems or tanks, which is a benefit from both a weight and cost perspective. The concepts described allow for bulk flow immersion cooling, directed flow immersion cooling of high power density components, gravity return immersion cooling such as the use of a storage tray holding the electronic device as described in application Ser. No. 16/137,015, filed on Sep. 20, 2018, and titled LIQUID SUBMERSION COOLED ELECTRONIC SYSTEMS AND DEVICES, and gravity assisted cooling for electronic boards which may protrude above the level of the fluid pool within the device housing, each of which can be accomplished at the same time in the same device housing.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A liquid submersion cooled electronic device, comprising:
   a non-pressurized device housing defining an interior space, the non-pressurized device housing including a tray with an at least partially open top and a cover removably attached to the tray and disposed over the at least partially open top;
   at least one heat generating electronic component disposed within the interior space of the non-pressurized device housing;
   a dielectric cooling liquid in the interior space, the dielectric cooling liquid partially or fully submerging and in direct contact with the at least one heat generating electronic component;
   a pump having a pump inlet in fluid communication with the interior space and a pump outlet;
   a heat exchanger having a heat exchanger inlet in fluid communication with the pump outlet and having a heat exchanger outlet in fluid communication with the interior space;
   a liquid distribution manifold within the interior space, the liquid distribution manifold having a manifold inlet in fluid communication with the heat exchanger outlet, and a plurality of manifold outlets;
   a tube having an inlet end thereof connected to one of the manifold outlets, and an outlet end thereof adjacent to the at least one heat generating electronic component to direct a return flow of dielectric cooling liquid to the at least one heat generating electronic component;
   an open top tray disposed within the interior space, the at least one heat generating electronic component is disposed within the open top tray, the outlet end of the tube is connected to the open top tray to direct the return flow of dielectric cooling liquid into a space defined by the open top tray, and a side wall of the open top tray includes a dielectric cooling liquid outlet weir from which dielectric cooling liquid exits the space defined by the open top tray.

2. The liquid submersion cooled electronic device of claim 1, wherein the pump is disposed within the interior space and the pump inlet is submerged in the dielectric cooling liquid.

3. The liquid submersion cooled electronic device of claim 1, wherein the heat exchanger is disposed within the interior space.

4. The liquid submersion cooled electronic device of claim 1, wherein the heat exchanger is disposed outside of the non-pressurized device housing.

5. The liquid submersion cooled electronic device of claim 1, wherein the pump and the heat exchanger are disposed at a first end of the non-pressurized device housing, and the liquid distribution manifold is disposed at a second end of the non-pressurized device housing opposite to the first end.

6. The liquid submersion cooled electronic device of claim 1, further comprising an air vent or pressure relief/equalization mechanism in the cover which provides air communication between the interior space and ambient environment.

7. The liquid submersion cooled electronic device of claim 1, wherein the least one heat generating electronic component comprises a plurality of heat generating electronic components within the interior space, and wherein the plurality of heat generating electronic components comprise a plurality of data storage devices, a plurality of power supplies, a plurality of processors, or a plurality of switches.

8. A liquid submersion cooled electronic system, comprising:
   a plurality of liquid submersion cooled electronic devices of claim 1 disposed in a vertical array on a rack.

9. A liquid submersion cooled electronic device, comprising:
   a device housing defining an interior space, the device housing including a tray with an at least partially open top and a cover removably attached to the tray and disposed over the at least partially open top;
   an air vent or pressure relief/equalization mechanism in the cover which provides air communication between the interior space and ambient environment;
   at least one heat generating electronic component disposed within the interior space of the device housing;
   a dielectric cooling liquid in the interior space, the dielectric cooling liquid partially or fully submerging and in direct contact with the at least one heat generating electronic component;
   a pump having a pump inlet in fluid communication with the interior space and a pump outlet;
   a heat exchanger having a heat exchanger inlet in fluid communication with the pump outlet, and a heat exchanger outlet in fluid communication with the interior space;
   a liquid distribution manifold within the interior space, the liquid distribution manifold having a manifold inlet in fluid communication with the heat exchanger outlet, and a plurality of manifold outlets;
   a tube having an inlet end thereof connected to one of the manifold outlets, and an outlet end thereof adjacent to the at least one heat generating electronic component to direct a return flow of dielectric cooling liquid to the at least one heat generating electronic component; and
   an open top tray disposed within the interior space, the at least one heat generating electronic component is disposed within the open top tray, the outlet end of the tube is connected to the open top tray to direct the return flow of dielectric cooling liquid into a space defined by the open top tray, and a side wall of the open top tray includes a dielectric cooling liquid outlet weir from which dielectric cooling liquid exits the space defined by the open top tray.

10. The liquid submersion cooled electronic device of claim 9, wherein the pump is disposed within the interior space and the pump inlet is submerged in the dielectric cooling liquid.

11. The liquid submersion cooled electronic device of claim 9, wherein the heat exchanger is disposed within the interior space.

12. The liquid submersion cooled electronic device of claim 9, wherein the heat exchanger is disposed outside of the device housing.

13. The liquid submersion cooled electronic device of claim 9, wherein the pump and the heat exchanger are disposed at a first end of the device housing, and the liquid distribution manifold is disposed at a second end of the device housing opposite to the first end.

14. The liquid submersion cooled electronic device of claim 9, wherein the least one heat generating electronic component comprises a plurality of heat generating electronic components within the interior space, and wherein the plurality of heat generating electronic components comprise a plurality of data storage devices, a plurality of power supplies, a plurality of processors, or a plurality of switches.

15. A liquid submersion cooled electronic system, comprising:
   a plurality of liquid submersion cooled electronic devices of claim 9 disposed in a vertical array on a rack.

* * * * *